United States Patent [19]

Nicholson et al.

[11] Patent Number: 5,415,127
[45] Date of Patent: May 16, 1995

[54] METHOD OF FORMING A SINGLE CRYSTAL FILM OF SODIUM-BETA "-ALUMINA

[75] Inventors: Patrick S. Nicholson, Ancaster; Aichun Tan, Dundas; Chu K. Kuo, Hamilton, all of Canada

[73] Assignee: Ontario Centre For Materials Research, Kingston, Canada

[21] Appl. No.: 88,316

[22] Filed: Jul. 7, 1993

[51] Int. Cl.[6] .............................................. C30B 25/08
[52] U.S. Cl. ........................................ 117/90; 117/84; 117/88
[58] Field of Search .................. 23/301; 156/612, 613, 156/614, 620.5, 624, DIG. 61; 423/119, 600; 117/84, 88, 90, 915, 937

[56] References Cited

U.S. PATENT DOCUMENTS

| | | | |
|---|---|---|---|
| 3,917,462 | 11/1975 | Yancey | 23/301 |
| 4,052,538 | 10/1977 | Eddy et al. | 429/193 |
| 4,244,986 | 1/1981 | Paruso | 427/126.4 |
| 4,375,701 | 2/1983 | Singh | 156/667 |
| 4,381,216 | 4/1983 | Singh | 156/667 |
| 4,381,968 | 5/1983 | Singh | 156/663 |
| 4,664,849 | 5/1987 | Farrington | 252/647 |
| 4,732,741 | 3/1988 | Duncan | 423/119 |
| 4,792,377 | 12/1988 | Dunn | 156/624 |
| 4,797,269 | 1/1989 | Bauer | 423/600 |
| 4,946,664 | 8/1990 | Van Zyl | 423/600 |

OTHER PUBLICATIONS

Chemical Abstracts vol. 107, 1987 No. 124803.

Primary Examiner—R. Bruce Breneman
Assistant Examiner—Felisa Garrett
Attorney, Agent, or Firm—Thomas A. O'Rourke

[57] ABSTRACT

Disclosed herein is a method of forming a single crystal film of sodium-beta"-alumina, comprising the steps of providing a single crystal substrate with one surface being arranged to minimize nucleation sites thereon, at least a portion of the substrate including alumina. A single crystal substrate is then deposited in a chamber, along with a precursor in the chamber. The precursor has a sufficient quantity of sodium species in a vapor phase and at an energy level sufficient to react with the alumina to form sodium-beta"-alumina. The precursor also includes a sufficient quantity of a stabilizing ion with a valence equal to or lower than aluminum to minimize decomposition of sodium-beta"-alumina to sodium-beta-alumina.

10 Claims, 13 Drawing Sheets

Bar = 30 μm

Bar = 1.85 μm

Bar = 3.00 μm

Bar = 5 μm

FIG. 13 (film3)

METHOD OF FORMING A SINGLE CRYSTAL FILM OF SODIUM-BETA "-ALUMINA

BACKGROUND OF THE INVENTION

1. Field of the Invention

The present invention relates to sodium-beta''-alumina and more particularly to a technique for forming a sodium-beta''-alumina single crystal film.

2. Description of the Related Art

In addition to being a super-ionic conductor, sodium-beta''-alumina may be used as a host for luminescent ions. Interesting optical properties have been found for lanthanide and transition metal ion-exchanged single crystals of sodium-beta''-alumina. Phase conjugation by degenerate four wave mixing has been demonstrated by $Nd^{3+}$-doped sodium-beta''-alumina. Efficient energy transfer has been detected in co-doped $Ce^{3+}$-$Nd^{3+}$-sodium-beta''-alumina and $Cu^+$-sodium-beta''-alumina shows optical memory and tunable emission properties throughout the visible spectrum. These unique optical properties when combined with the separation of the crystal-growth and doping process lead to promising potential applications in solid-state lasers, holography, signal and image processing, phosphor chemistry and other optical components and devices.

Practical applications will require large size single crystal sodium-beta''-alumina. It is an object of the present invention to provide a novel method of growing large size single-crystal sodium-beta''-alumina films.

SUMMARY OF THE INVENTION

Briefly stated, the invention involves a method of forming a single crystal film of sodium-beta''-alumina, comprising the steps of:
  providing a single crystal substrate with one surface being arranged to minimize nucleation sites thereon, at least a portion of said substrate including alumina
  depositing the single crystal substrate in a chamber;
  depositing a precursor in the chamber, the precursor including a sufficient quantity of sodium species in a vapour phase and at an energy level sufficient to react with the alumina to form sodium-beta''-alumina, the precursor also including a sufficient quantity of a stabilizing ion with a valence equal to or lower than aluminum to minimize decomposition of sodium-beta''- to sodium-beta-alumina.

BRIEF DESCRIPTION OF THE DRAWINGS

Preferred embodiments of the present invention will be described with respect to the appended drawings in which.

DESCRIPTION OF THE PREFERRED EMBODIMENTS

The present invention concerns a novel method of forming a single crystal film of sodium-beta''-alumina. As will be described below, the method involves the following steps:
  i) providing a single crystal substrate with one surface being arranged to minimize nucleation sites thereon. At least a portion of the substrate should include alumina;
  ii) depositing the single crystal substrate in a chamber;
  iii) depositing a precursor in the chamber. In this case, the precursor includes a sufficient quantity of sodium species in a vapour phase and at an energy level sufficient to react with the alumina to form sodium-beta''-alumina. The precursor should also include a sufficient quantity of a stabilizing ion with a valence equal to or lower than that of aluminum to minimize decomposition of sodium-beta''- to sodium-beta-alumina.

Figure 1:
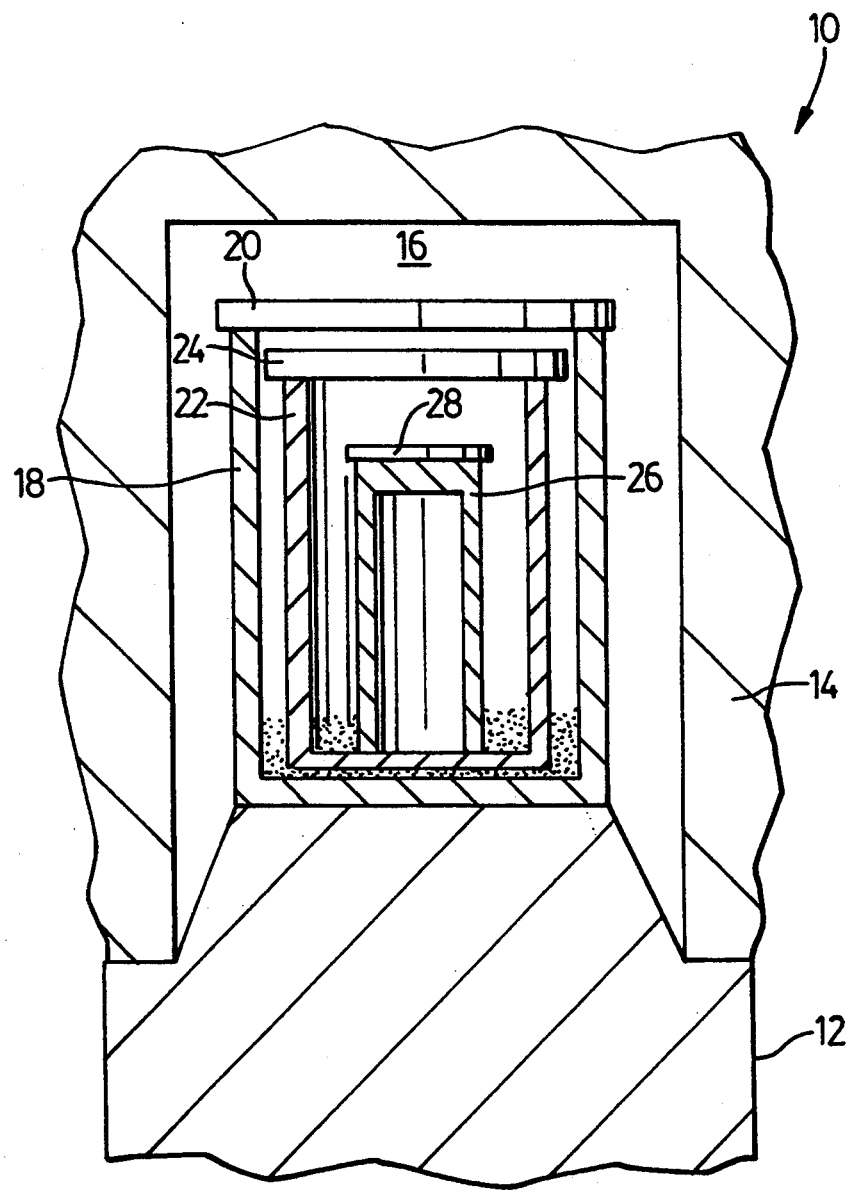
FIG. 1 is a cross section of a device for forming a sodium-beta''-alumina single crystal film.

FIG. 1 shows an apparatus for forming sodium-beta''-alumina, including an oven 10 having a removable plug 12 and a housing 14, together forming a chamber 16. Positioned on the plug 12 is an outer crucible 18 with a lid 20. Positioned inside the outer crucible is an inner crucible 22 with a lid 24. Contained within the inner crucible is a support 26 with an upper surface on which is positioned a single crystal alumina substrate 28 (also known as a 'sapphire' substrate). A precursor powder is deposited in both the inner and outer crucibles.

Sodium-beta-alumina phase may be formed at temperatures of greater than 1200 degrees C. via the reaction:

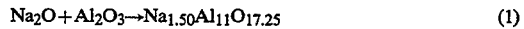

$$Na_2O + Al_2O_3 \rightarrow Na_{1.50}Al_{11}O_{17.25} \qquad (1)$$

The formation of sodium-beta''-alumina requires a stabiliser, usually $Mg^{2+}$ or $Li^+$, that is:

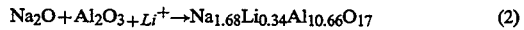

$$Na_2O + Al_2O_3 + Li^+ \rightarrow Na_{1.68}Li_{0.34}Al_{10.66}O_{17} \qquad (2)$$

The precursor powder mixture, along with the temperature and pressure conditions are selected to form a sodium-beta''-alumina single crystal layer 'on' the substrate according to equation (2). The term 'on' is qualified because the characteristics of the resulting single crystal layer make it apparent that the layer is grown on the substrate. However, measurements of the layers formed by the present technique show that the single crystal layer is formed essentially by the ions from the atmosphere penetrating into the lattice of the substrate. Through a process of chemical epitaxy, the substrate is transformed into sodium-beta''-alumina.

It is important that the atmospheric conditions, its composition and the finish of the surface of the substrate be selected to encourage single crystal growth and discourage polycrystalline growth.

The roughness of the surface should be minimized to reduce the number of nucleation sites thereon. For example, a commonly available 'optically polished' surface is one type of surface that is suitable for forming sodium-beta''-alumina single crystals.

Contrary to the conventional techniques to form sodium-beta-beta''-alumina crystals, the present technique involves a chemical reaction from the vapour state of the atmosphere to the crystal lattice of the substrate. The atmosphere should provide a sufficient amount of sodium ion to permit the formation of the sodium oxygen layers which are characteristic of sodium-beta-alumina as well as sodium-beta''-alumina. Furthermore, the atmosphere must provide sufficient stabilizing ion, for example $Li^+$, to displace some aluminum ions in the spinel block, in order to increase the concentration of sodium ions in the sodium oxygen layer, which is characteristic of sodium-beta''-alumina.

As a result, the precursor powder should have be a mixture of 95 percent sodium-beta''-alumina and 5 percent of lithium-beta''alumina.

The atmosphere should be at a temperature of at least 1200 degrees Celsius. The sodium-beta''-alumina phase may form at less than 1200 degrees Celsius but the reaction rate is very slow. X-Ray Diffraction (that is XRD) patterns of samples made according to the present technique at temperatures below 1200 degrees Celsius show minimal sodium-beta''-alumina even after 17 hours at 1200 degrees Celsius. Other samples revealed no measurable sodium-beta''-alumina when reacted at 1150 degrees Celsius for long periods.

It is believed that the chemical reaction accelerates with increased temperature because both the $Na_2O$ partial pressure and the $Na^+$ diffusion rate into the substrate increase with increasing atmospheric temperature. However, increasing temperatures also render the so-formed sodium-beta''-alumina less stable and it converts to sodium-beta-alumina. As a result, a stabilizer such as $Mg^{2+}$ or $Li^+$ must be used to stabilize the sodium-beta''-alumina phase at temperatures of greater than 1200 degrees Celsius. $Mg^{2+}$ is only available in the solid state since its source MgO is highly refractory. $Li_2O$ on the other hand, has a comparable subliming point to $Na_2O$. Therefore, the $Li_2O$ and $Na_2O$ together will react in the vapour phase with alumina substrates at temperatures greater than 1200 degrees Celsius.

In fact, with the $Li_2O$ stabilizer, operating temperatures of up to 1350 degrees Celsius can be utilized by physically separating the precursor powder from the substrate. Otherwise, at these temperatures, solids from the powder may become entrained in the vapour and collide with the substrate causing new nucleation sites and destroying the single crystal nature of the film. To avoid this, the substrate may be positioned on a support and deposited in a small inner crucible with the precursor deposited in the crucible at the base of the support. The inner crucible may then be deposited in a larger outer crucible as shown in FIG. 1.

If the temperature is between 1200 and 1350 degrees Celsius, sodium-beta''-alumina can nucleate and grow from $Li_2O + Na_2O +$ alpha-alumina without the formation of sodium-beta-alumina. For example, if the temperature is too high, for example 1350 degrees Celsius, some of the sodium-beta''-alumina will transform into sodium-beta-alumina. The temperature level may be somewhere in the 1300 to 1400 degree Celsius range depending on several conditions:

i) the concentration of sodium in the vapour phase;

If the concentration of sodium to alumina in the resulting single crystal film is maintained at $Na_2O/Al_2O_3 = 1/5-1/7$, then the temperature can be higher while keeping the sodium-beta''-alumina stable. If, on the other hand, the concentration is lower than 1/7 then the temperature should be lower to maintain the sodium-beta''-alumina. This is due to the fact that the beta-alumina phase will nucleate and, being more thermodynamically stable, will grow at the expense of the beta''-alumina phase.

ii) the concentration of oxygen and water;

The less water in the atmosphere, the higher the temperature can be while maintaining the sodium-beta''-alumina. The higher the concentration of oxygen, the higher the temperature can be while maintaining the sodium-beta''-alumina. This is due to the fact that water promotes formation of NaOH vapour species thus removing the $Na_2O$ from the beta''-alumina and thus promoting its conversion of beta-alumina. Oxygen depresses the equilibrium pressure of Na-species, thus increasing $Na_2O$ concentration in the grown beta''-alumina phase.

Figure 2:
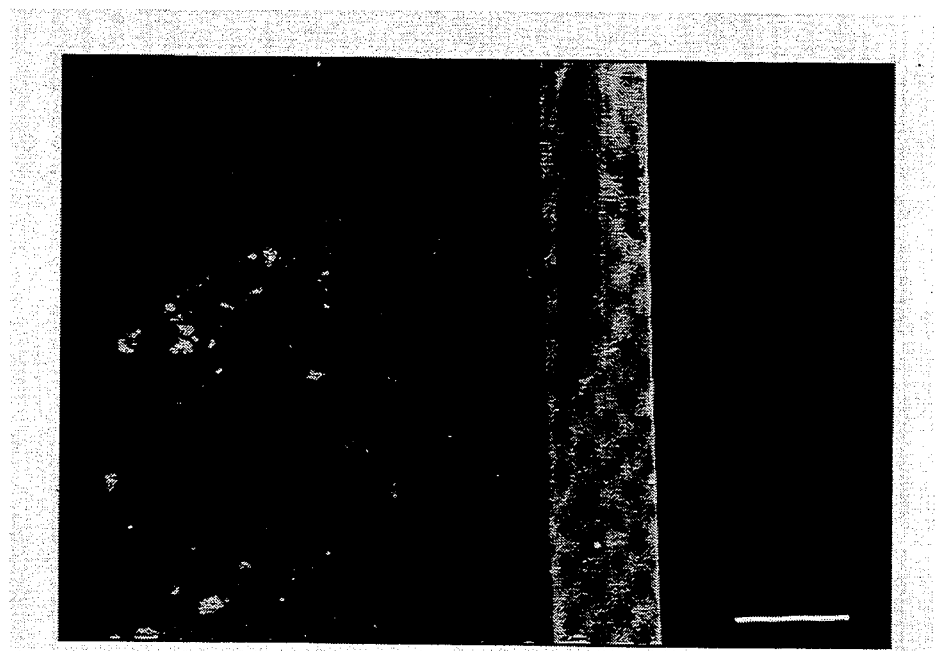
FIG. 2 is a sectional view of a single crystal sample.

The growth of sodium-beta''-alumina single crystal film in the present technique involves a number of phenomena, that is diffusion, reaction, nucleation and crystal growth. In some cases, high temperature and fast growth rates can have disadvantages and lower temperatures and growth rates may be more desirable. The best sodium-beta''-alumina single crystal films were obtained after four days at 1200-1300 degrees Celsius. FIG. 2 is a section of a successfully grown single crystal sodium-beta''-alumina film.

Figures 3A, 3B:
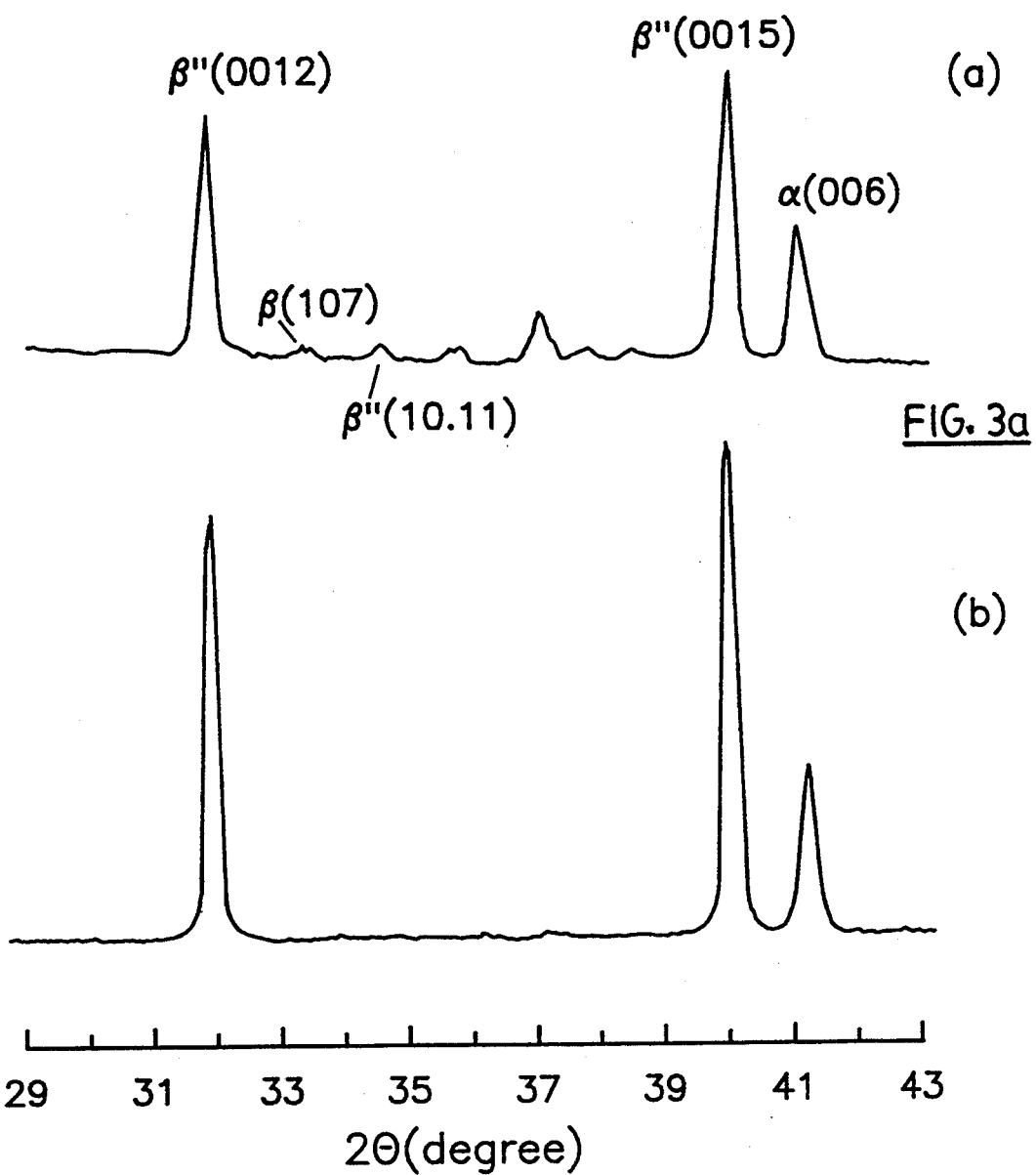
FIGS. 3a and 3b are X-Ray diffraction traces for two crystal samples.

The single crystal alumina substrate is selected because the 001 plane of the substrate closely resembles the 001 plane of the sodium-beta''-alumina. Sodium-beta-alumina and sodium-beta''-alumina crystal structures are virtually identical accept in a few planes. This means that an XRD pattern for sodium-beta-alumina shown in FIG. 3b will be identical to sodium-beta''-alumina in the 001 direction as shown in FIG. 3a. The poly-crystalline growth on an unpolished surface may be used to detect differences between sodium-beta''-alumina and sodium-beta-alumina since the poly-crystalline structure exposes the few planes which distinguish the sodium-beta''-alumina and the sodium-beta-alumina, for example, beta (107) and beta'' (10.11).

In addition to the temperature level of the atmosphere, the heating rate of the atmosphere may become important if the thickness of the substrate is greater than one millimeter.

As mentioned, the $Li_2O$ content in the reaction atmosphere significantly influences the phase composition of the growing film at a temperature of 1200 degrees Celsius. In turn, the $Li^+$ ion content in the reaction atmosphere is controlled by the $Li_2O$ content of the precursor powder. An XRD investigation of this influence was carried out on poly-crystalline films.

Figure 4:
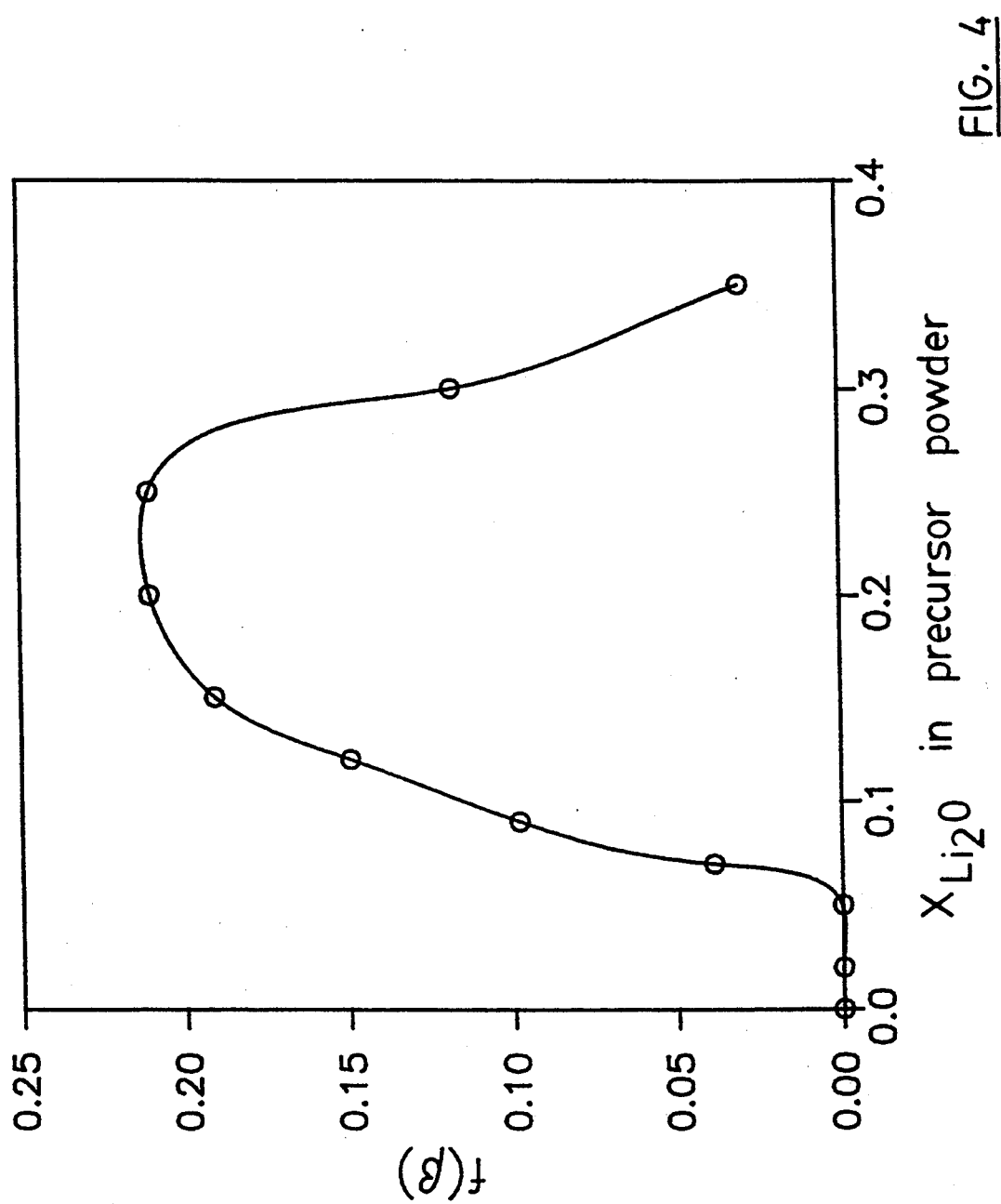
FIG. 4 is a plot of the influence of one atmospheric constituent content versus the phase composition of grown films.

FIG. 4 plots the influence of $Li^{2+}$ content in the atmosphere versus the fraction of sodium-beta-alumina phase in the film. No sodium-beta-alumina phase forms at 1200 degrees Celsius if $X_{Li_2O}$ (that is the mole ratio of Li$_2$O/(Li$_2$O+Na$_2$O)) is less than 5 percent in the precursor powder. A maximum fraction of beta-alumina phase (f(beta)) occurs for X$_{Li2O}$ equalling 20 to 25 percent, followed by a sharp drop. When X$_{Li2O}$ is greater than 0.35, the intensity of diffraction from both phases is too low to determine. Of course, varying the atmospheric temperature may vary these results.

Figure 5:
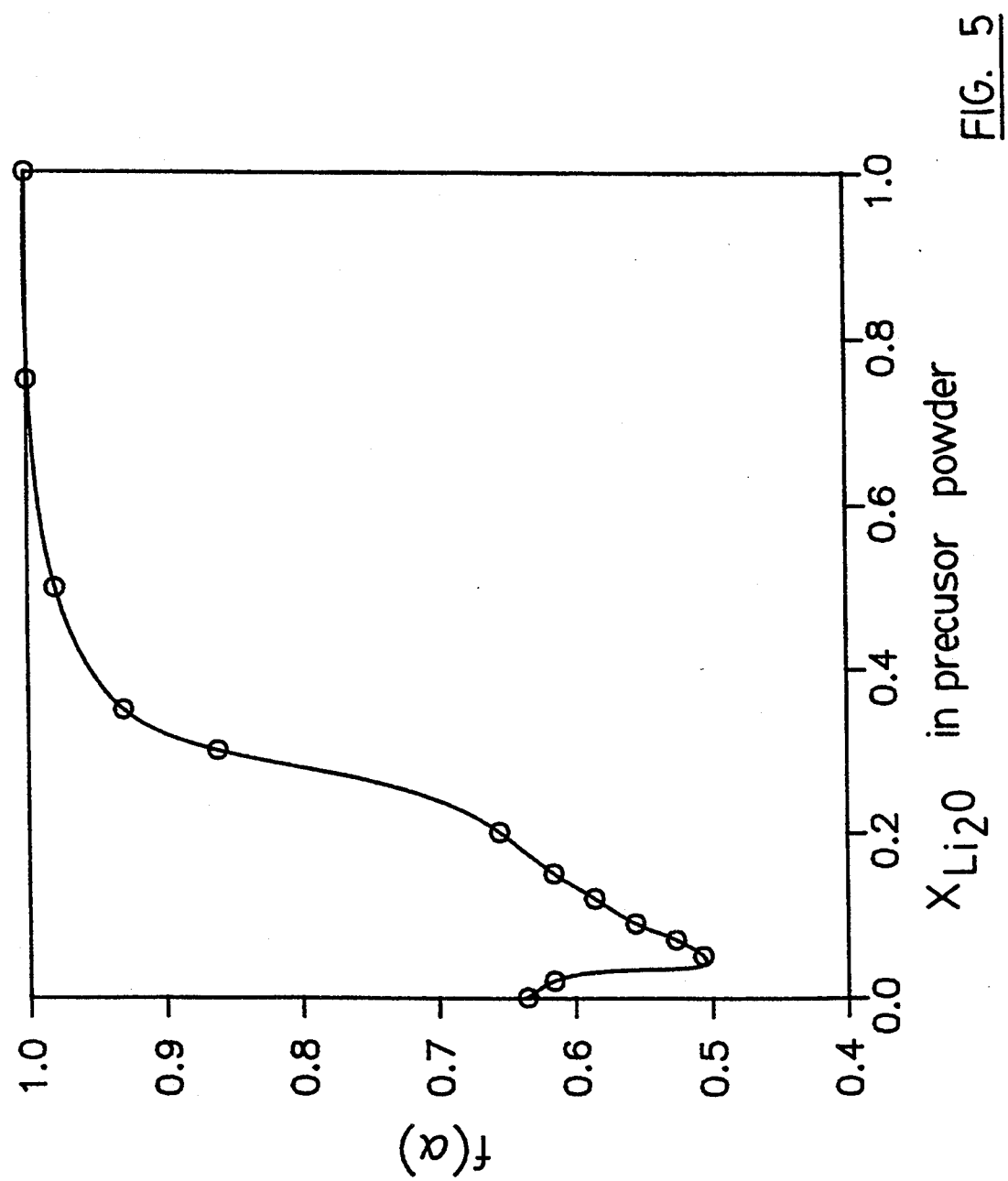
FIG. 5 is another plot of the influence of one atmospheric constituent content versus the phase composition of grown films.

The Li$^+$ ion content of the atmosphere not only influences the phase composition of the growing film, but also the formation rate of both phases. FIG. 5 shows how the f($\alpha$) changes with X$_{Li2O}$ in the covering powder, where:

$$f(\alpha) = \frac{\text{Intensity of (006) diffraction of } \alpha\text{-Al}_2\text{O}_3}{\text{Intensity of (beta''(10}\underline{11}) + \text{beta(107)} + \text{alpha(006) diffractions)}}$$

This factor tracks the thickness of the grown film and the thickest was obtained at X=0.05. Sodium-beta- and sodium-beta''alumina phases were minimal at X=0.5. As a result, the preferred proportion of Li$_2$O in the precursor powder may be chosen in the area of X$_{Li2O}$=0.05.

To form a single crystal film of sodium-beta''-alumina on a substrate, three conditions should be controlled, that is:
 i) the growth rate should be high;
 ii) the nucleation rate should be low; and
 iii) the stresses involved should be low.

It is important that the substrate have a similar crystal structure to the spinel blocks of the sodium-beta''-alumina phase to ensure a high growth rate. The oxygen ions in the spinel blocks of sodium-beta''-alumina are face centred cubic close packed. If the structure of the oxygen ions of the substrate is also close packed, as is the case on the 001 planes of the single crystal alumina substrate, growth of sodium-beta''-alumina phase therein will be a relatively low energy process compared with growth on other planes.

Single crystal alumina is the best choice for its oxygen sub-lattice is close packed. Moreover, alumina is one of the reactants required for the formation of sodium-beta''-alumina. The first few nuclei formed in the crystallographic (001) direction with the lowest nucleation and growth energy will grow very fast to large size grains progressively eliminating smaller grains of higher energy morphology. The latter have a slower growing rate because of the higher energy required thus they combine into one single crystal.

Figure 6A:
FIGS. 6a and 6b are electron micrograph images of single crystal and polycrystal samples respectively.
Figure 6B:

The single crystal alumina substrate should be optically polished to minimize the number of available nucleation sites thereon. The 'optically polished' standard is widely used in the industry and virtually any 'optically polished' substrate commercially available should be satisfactory. Optically polished surfaces should provide a uniform growth energy level over the entire surface thus inducing all nuclei to form in the same crystallographic direction and merge into a single grain on contact. The SEM microstructure of sodium-beta''-alumina films grown on polished and unpolished substrates are shown in FIGS. 6a and 6b respectively. FIG. 6a shows a single crystal sodium-beta''-alumina film (confirmed by XRD) grown on a polished single crystal matrix. The parallel and 120 degree angular white lines indicate the growth plateau of the single crystal sodium-beta''-alumina film and were highlighted by the long time exposure to the electron beam or reaction between alkali ions, CO$_2$ and moisture in the air. The multiple grains that grow on an unpolished surface are very clearly seen in FIG. 6b.

Figure 7:
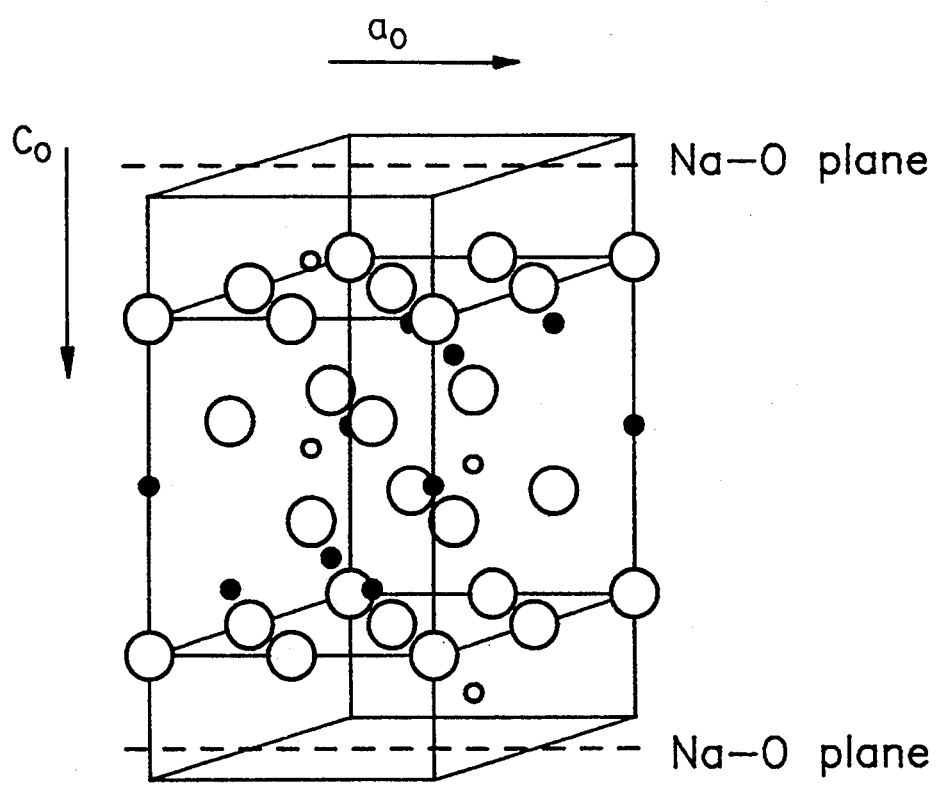
FIG. 7 is an atomic perspective view of a ⅓ of the unit cell of sodium-beta''-alumina showing the Al-O spinel block.
Figure 12:
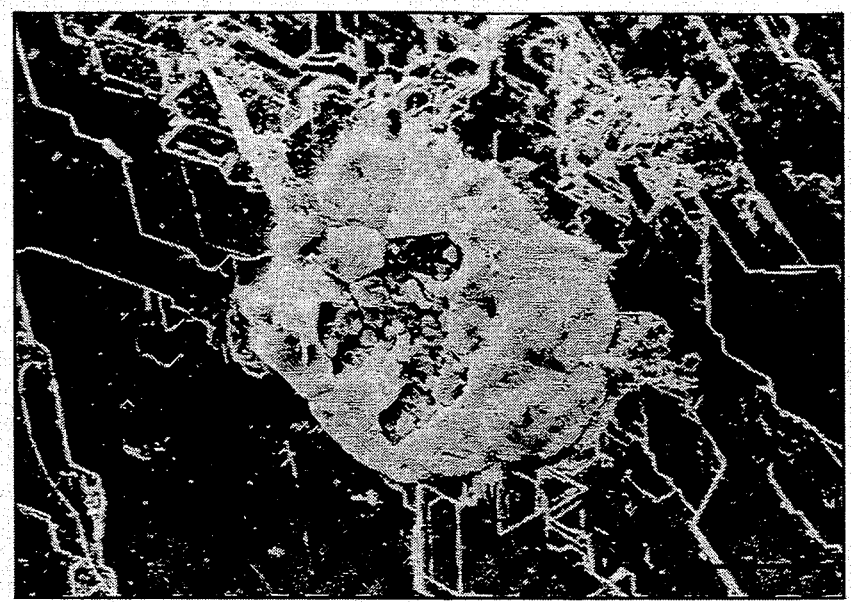
FIG. 12 is an electron micrograph of another crystal sample.

Referring to FIG. 7, volume change often accompanies phase transformation and, if the growing direction of the sodium-beta''-alumina film is not correctly chosen, the elongation of the C$_o$ parameter during formation will induce stress even though the substrate has a similar crystal structure. When these stresses accumulate to a level exceeding the strength of sodium-beta''-alumina, cracks could initiate. New grains then nucleate on the cracks as shown in FIG. 12, and grow in random directions causing the film to become poly-crystalline.

Figure 8:
FIGS. 8 and 9 are Laue back reflection photographs of single crystal samples.
Figure 9:

The formation of sodium-beta''-alumina on an single crystal alpha-alumina substrate is small in the a$_o$ direction. As a result, the a$_o$ growth direction, that is on the (001) plane, is optimum and results in almost stress-free film growth. FIGS. 8 and 9 are Laue back-reflection photographs of Li-stabilized sodium-beta''-alumina films grown in the (110) and (001) planes respectively. The rings in the centre of a spot pattern of FIG. 8 indicate a poly-crystalline film formed on the (110) single crystal substrate. The tri-symmetric diffraction pattern of FIG. 9 is that of single crystal sodium-beta''-alumina overlapped on alpha-alumina.

EXAMPLE

A single crystal sodium-beta''-alumina film (less than 100 $\mu$m thick) was grown on a single crystal alumina substrate. The substrate was placed in the device of FIG. 1 on a support which was placed in an inner crucible. A precursor powder mixture was deposited in the inner crucible which was then covered. The inner crucible was placed in an outer crucible. The same precursor powder mixture was deposited in the outer crucible. The powder mixture was roughly 95 percent sodium-beta''-alumina powder and 5 percent lithium-beta''-alumina powder.

The outer crucible was placed in an oven and heated for 32 hours at a temperature of about 1350 degrees Celsius.

To minimize stresses on the oven and the crucible, the temperature was initially raised at a relatively gradual rate such as 5 degrees Celsius per minute.

Figure 10:
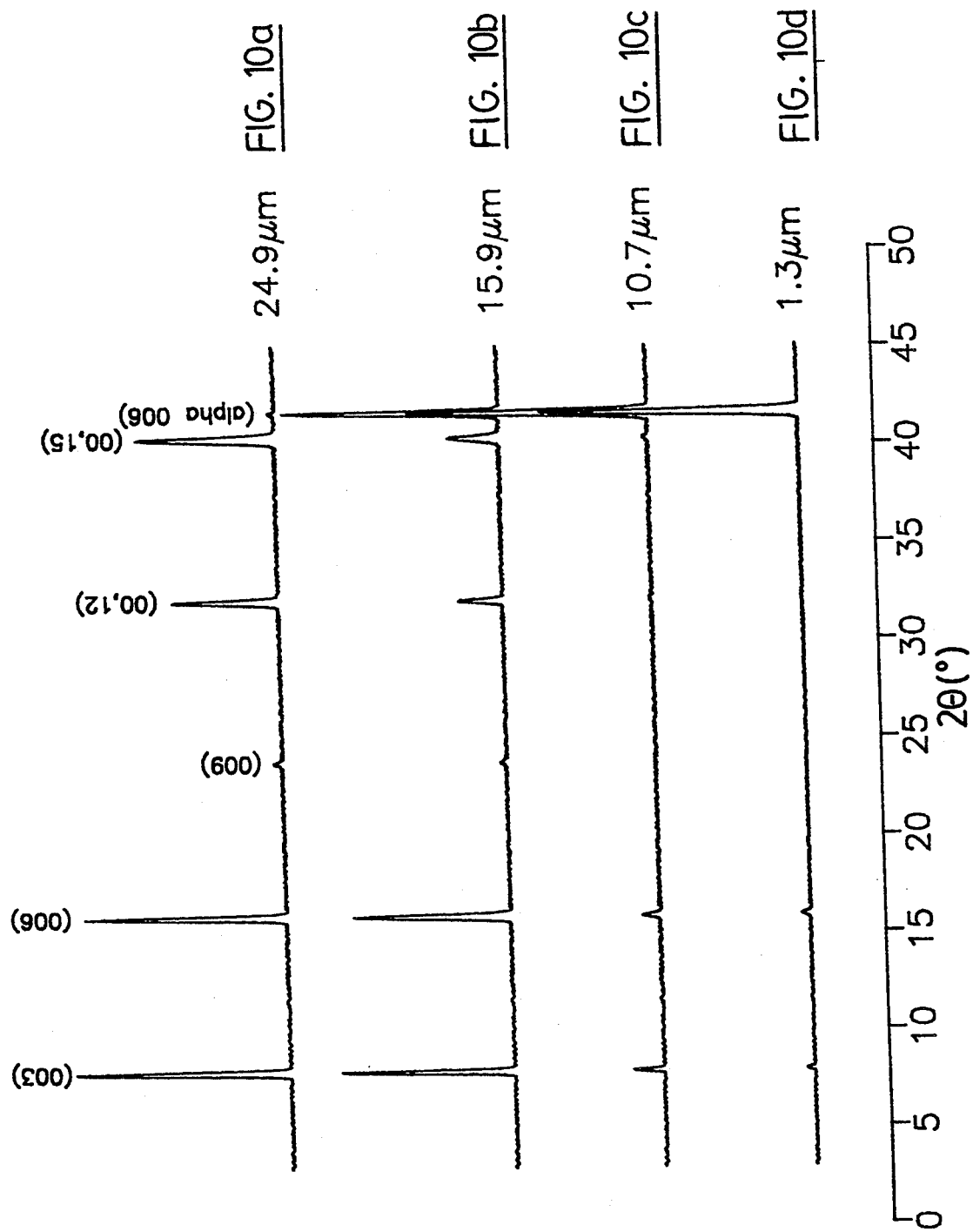
FIGS. 10a to 10d are successive X-Ray diffraction traces for a single crystal sample.

The sample was withdrawn from the oven and was measured to have a thickness of about 30 to 40 $\mu$m. The sample was ground and polished and measured to a thickness of 24.9 $\mu$m. The sample was analyzed with XRD and the results are shown in FIG. 10a. The sample was reground, polished measured and analyzed three more times to produce diffraction patterns as shown in FIGS. 10b, 10c and 10d.

It will be seen that for FIGS. 10a and 10b, there are six peaks, the farthest right representing the 006 crystal plane of alpha-alumina. The remaining five peaks represent crystal plane in sodium-beta''-alumina. The 003, 00,12 and 00,15 planes were selected for further analysis.

Figure 11:
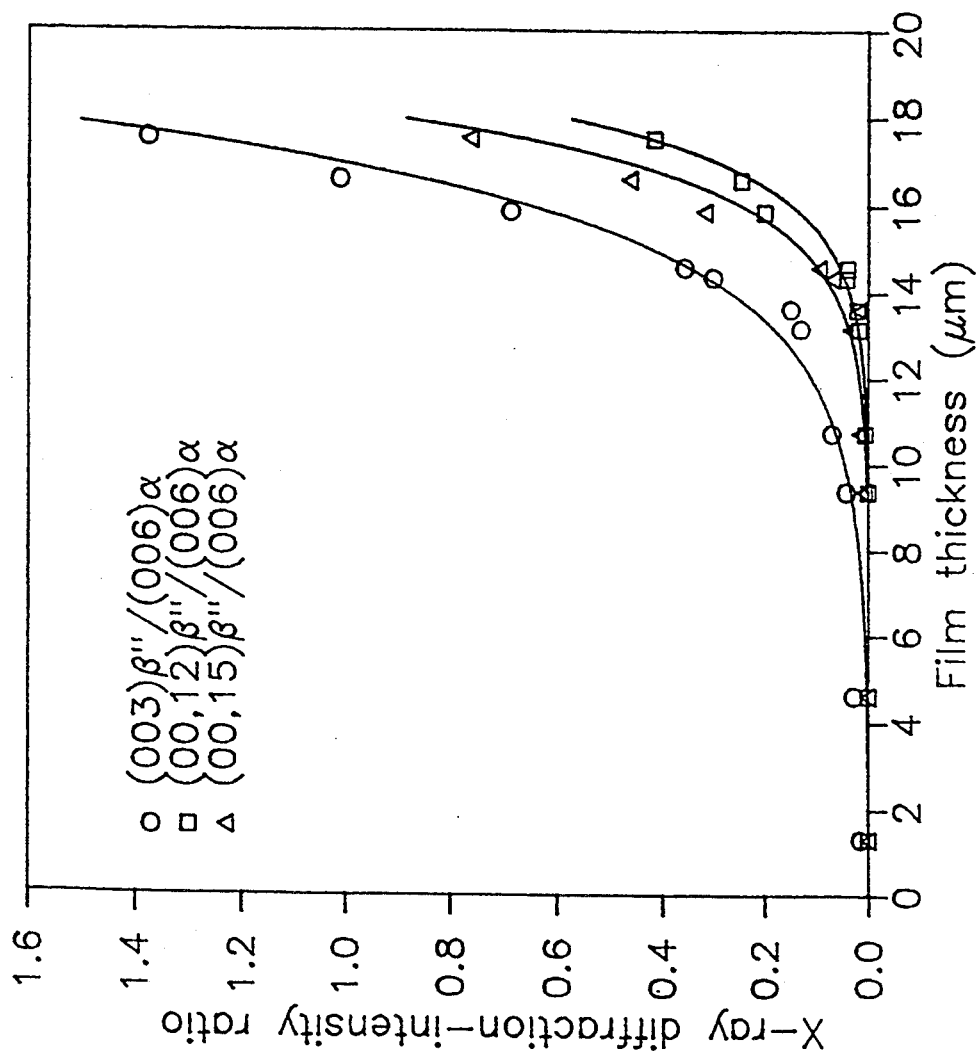
FIG. 11 is a plot of X-ray diffraction intensity ratio versus film thickness for a single crystal sample.

FIG. 11 shows X-Ray diffraction intensity ratio for the 003, 0012 and 0015 sodium-beta''-alumina crystal planes relative to the intensity of the alpha-alumina 006 plane. The curves in FIG. 11 demonstrate the relationship between the film thickness and the X-ray diffraction intensity ratio. This means that the thickness of the single crystal film can be determined from the XRD pattern. In this case, the thickness of the film was 40 $\mu$m.

Figure 13:
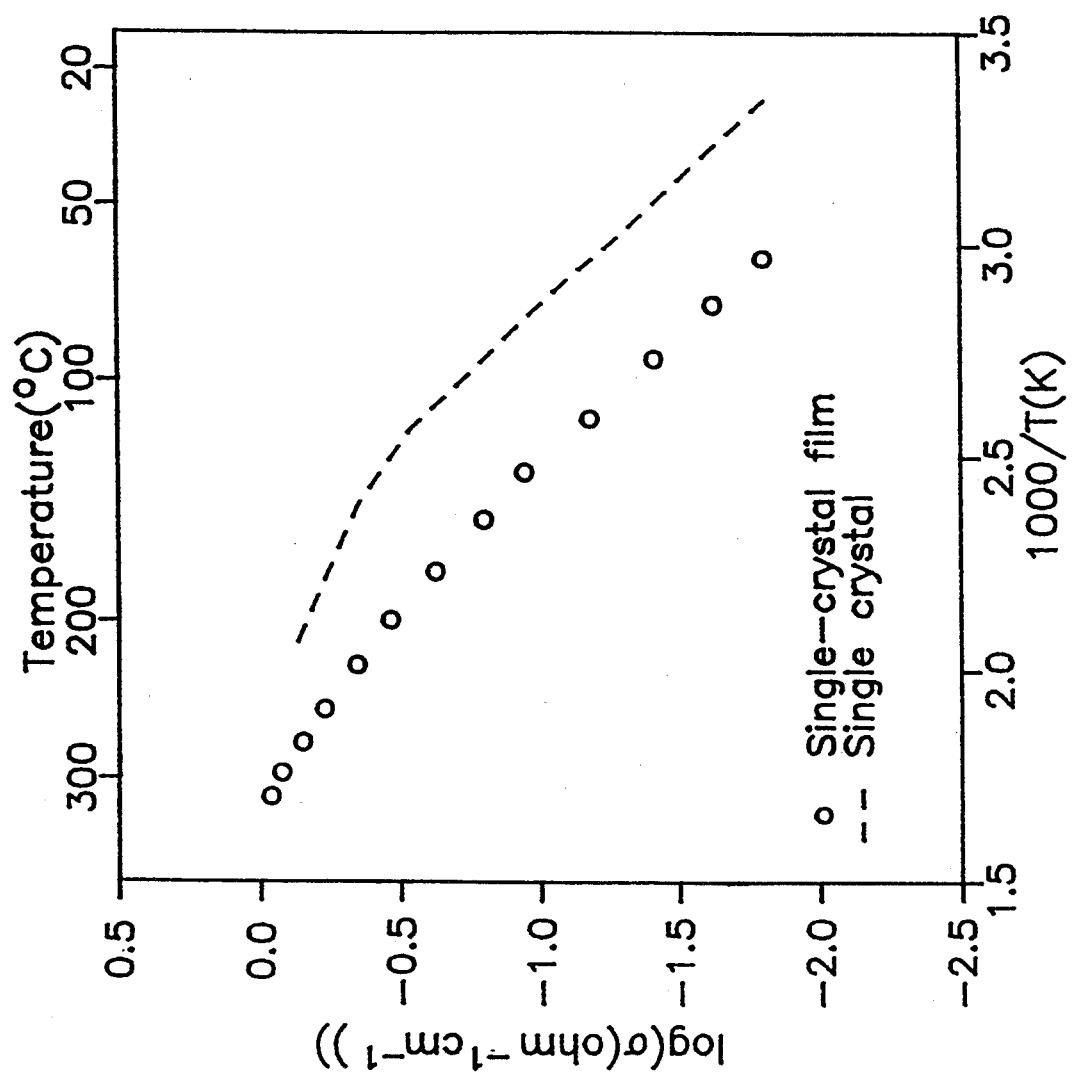
FIG. 13 is a comparative plot of a conductivity value of a single crystal film versus a value for a single crystal film sample.

FIG. 13 is provided as a comparative plot of a conductivity value of a single crystal of sodium-betas''- alumina shown in dashed lines to a single crystal film of sodium-beta"-alumina shown by the hollow bullets.

Figure 14:
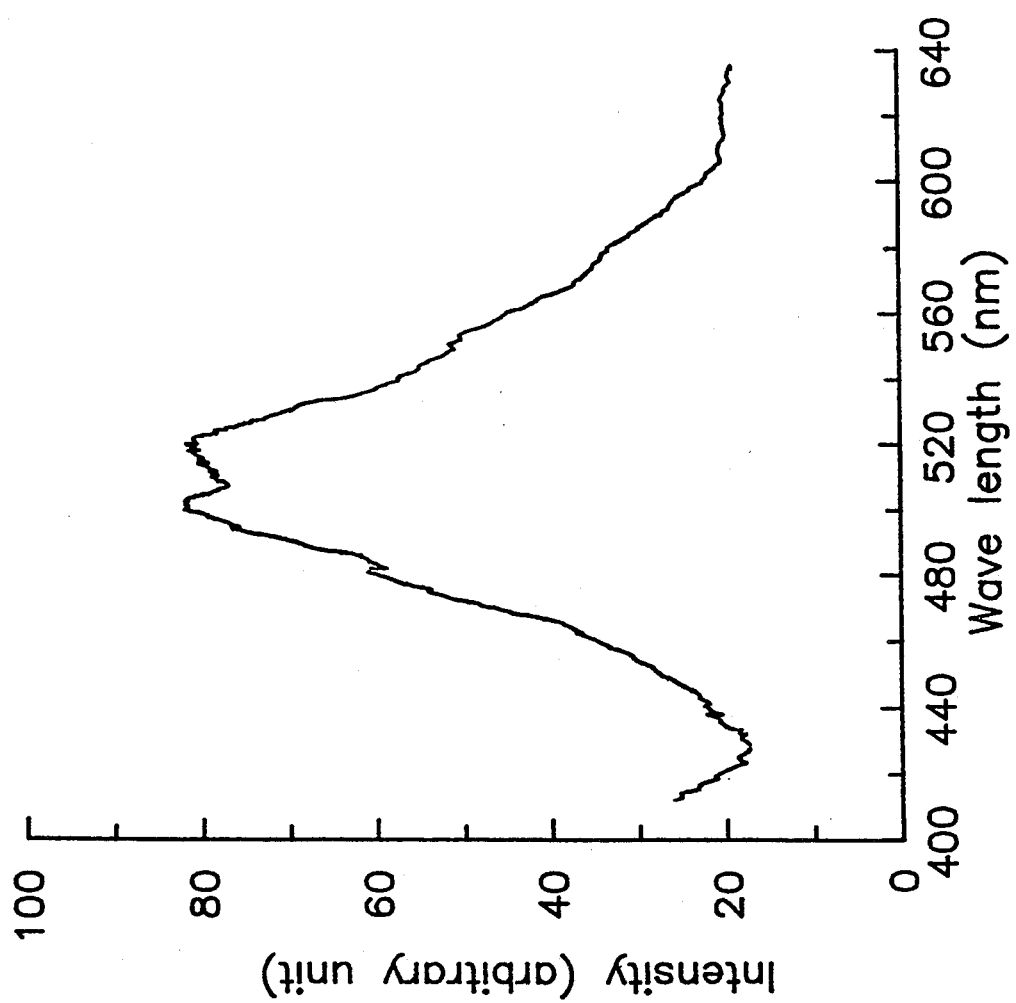
FIG. 14 is an emission spectrum for a single crystal sample.

FIG. 14 is an emission spectrum for a single crystal film of a Ca+-doped sodium-beta"-alumina.

We claim:

1. A method of forming a single crystal film of sodium-beta"-alumina, comprising the steps of:
    providing a single crystal substrate wherein said single crystal substrate is alpha-alumina and includes an optically smooth surface which is parallel to a (001) crystal plane;
    depositing said single crystal substrate in a chamber;
    depositing a precursor in said chamber in such a manner that said precursor and said substrate are physically separated from one another;
    heating said chamber wherein said precursor provides a quantity of sodium species in a vapour phase and at an energy level to react with said alpha-alumina at said surface to form sodium-beta"-alumina, the precursor also providing a quantity of a stabilizing ion with a valence equal to or lower than aluminum to minimize decomposition of sodium-beta"-alumina to sodium-beta-alumina.

2. A method as defined in claim 1 wherein said stabilizing ion is lithium and said precursor is heated to a temperature not exceeding 1350 degrees Celsius.

3. A method as defined in claim 2 wherein said temperature is between 1200 and 1350 degrees Celsius.

4. A method as defined in claim 1 wherein said single crystal is alumina spinel.

5. A method as defined in claim 1 wherein said step of depositing said single crystal substrate in a chamber includes the steps of:
    providing an inner crucible;
    depositing said precursor in said inner crucible;
    supporting said substrate in said inner crucible and above said precursor; and
    closing said crucible.

6. A method as defined in claim 5 wherein said step of depositing said single crystal substrate in a chamber includes the steps of;
    providing an outer crucible;
    positioning said inner crucible inside said outer crucible;
    depositing said precursor in said outer crucible; and
    closing said outer crucible.

7. A method of forming a single crystal film of sodium-beta"-alumina, comprising the steps of:
    providing a single crystal substrate wherein said single crystal substrate is alpha-alumina and includes an optically smooth surface which is parallel to a (001) crystal plane;
    depositing said substrate in a chamber;
    depositing a precursor in said chamber in such a manner that said precursor and said substrate are physically separated from one another;
    heating said chamber to a temperature between 1200 and 1350 degrees Celsius wherein said precursor provides a quantity of sodium species in a vapour phase and at an energy level to react with said alumina at said surface to form sodium-beta"-alumina, the precursor also to provide a quantity of a lithium stabilizing ion to minimize decomposition of sodium-beta"-alumina to sodium-beta-alumina.

8. A method as defined in claim 7 wherein said step of depositing said single crystal substrate in a chamber includes the steps of:
    providing an inner crucible;
    depositing said precursor in said inner crucible;
    supporting said substrates inside said inner crucible and above said precursor; and
    closing said crucible.

9. A method as defined in claim 8 wherein said step of depositing said single crystal substrate in a chamber includes the steps of;
    providing an outer crucible;
    positioning said inner crucible inside said outer crucible;
    depositing said precursor in said outer crucible; and
    closing said crucible.

10. A method as defined in claim 9 wherein said step of supporting said substrate inside said inner crucible and above said precursor includes the steps of:
    providing a support in said inner crucible; and
    positioning said substrate on said support.

* * * * *